United States Patent
Lu

(10) Patent No.: US 10,361,700 B1
(45) Date of Patent: Jul. 23, 2019

(54) TESTING METHOD TO QUANTIFY PROCESS VARIATION DISTRIBUTION IN PHYSICALLY UNCLONABLE FUNCTION DEVICE, COMPUTER READABLE MEDIUM THEREOF

(71) Applicant: Taiwan Semiconductor Manufacturing Co., Ltd., Hsinchu (TW)

(72) Inventor: Shih-Lien Linus Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/231,623

(22) Filed: Dec. 24, 2018

(51) Int. Cl.
   *H03K 19/003* (2006.01)
   *G11C 11/419* (2006.01)
   *G11C 11/412* (2006.01)

(52) U.S. Cl.
   CPC ...... *H03K 19/00315* (2013.01); *G11C 11/412* (2013.01); *G11C 11/419* (2013.01)

(58) Field of Classification Search
   None
   See application file for complete search history.

(56) References Cited

U.S. PATENT DOCUMENTS

| | | | |
|---|---|---|---|
| 10,164,640 B1 * | 12/2018 | Lu | G06F 21/73 |
| 2016/0204781 A1 * | 7/2016 | Plusquellic | H03K 19/00323 326/8 |
| 2018/0040356 A1 * | 2/2018 | Hung | G06F 13/42 |

* cited by examiner

*Primary Examiner* — Jany Richardson
(74) *Attorney, Agent, or Firm* — JCIPRNET

(57) ABSTRACT

A process variation evaluation method and a process variation evaluating device are provided. The process variation evaluation method is adapted to an electronic device having a PUF device, a recording array and a controller, and includes: iteratively powering up the PUF device in various conditions and detecting a state change of each of the PUF cells in the PUF device by the controller, in which the controller compares a current state in a current iteration and a previous state in a previous iteration of each PUF cell to detect the state change and setting a value indicating the state change in a corresponding bit in the recording array; counting a number of bits with the set value in the recording array after a plurality of iterations; and evaluating a variation of a process according to the counted number by the controller.

20 Claims, 8 Drawing Sheets

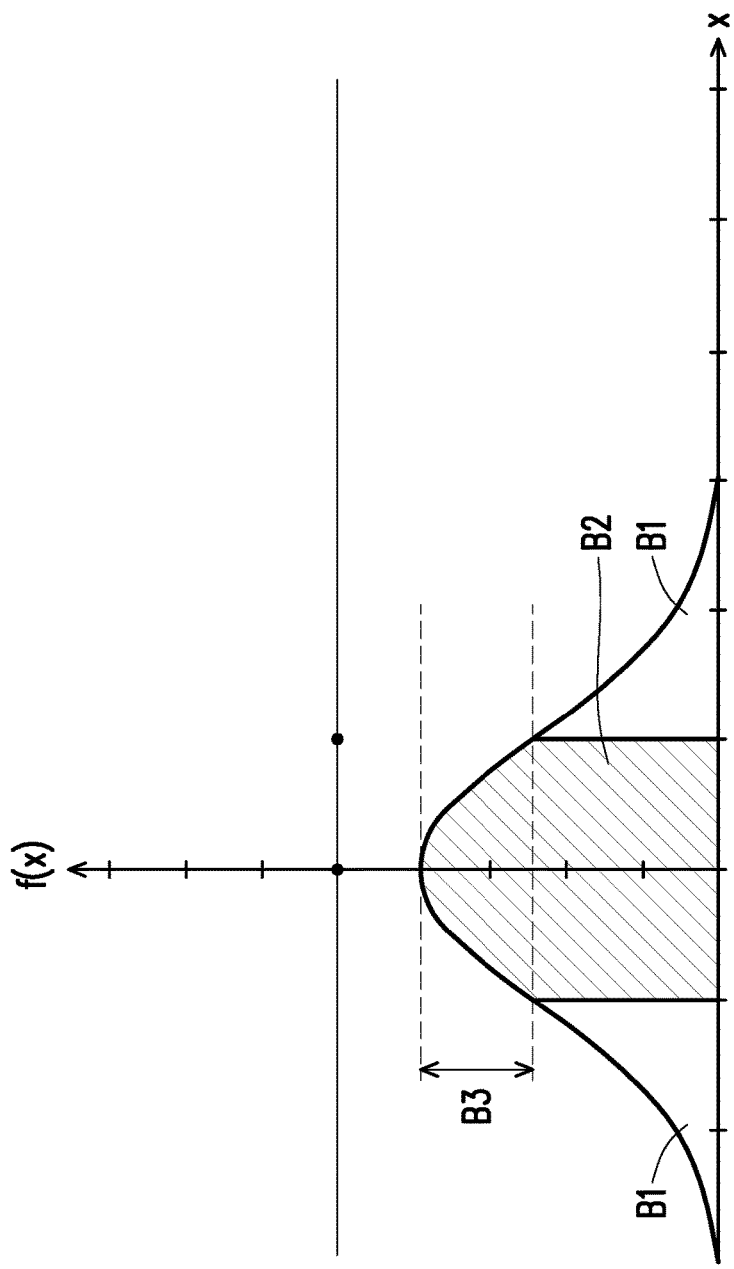

TESTING METHOD TO QUANTIFY PROCESS VARIATION DISTRIBUTION IN PHYSICALLY UNCLONABLE FUNCTION DEVICE, COMPUTER READABLE MEDIUM THEREOF

BACKGROUND

In the field of semiconductor manufacturing, as CMOS technology continues to scale down the size to nanometers, many challenges start emerging. One of the challenges on scaling down the size is process variations. These variations affect the transistor characteristics, which in terms produce critical path to logic circuits to have different delays, memory read/write failure, and higher static currents. In general, circuits need to be designed conservatively to cope with performance losses introduced by process variations. That is, the manufacturer needs to reserve more margins which lead to larger area (cost) and higher power consumption.

Therefore, there is a need to understand and quantify process-induced variability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A, 6B and 6C illustrate normal distribution plots of stable and unstable bits in the physically unclonable function (PUF) device according to an exemplary embodiment of the disclosure.

DESCRIPTION OF THE EMBODIMENTS

Figure 1:
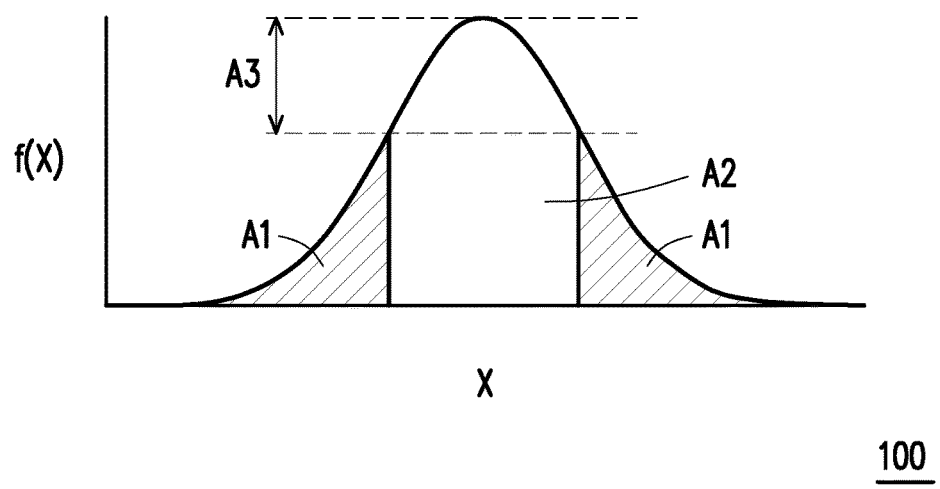
FIG. 1 illustrates a normal distribution plot of stable and unstable bits in the physically unclonable function (PUF) device according to an exemplary embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although manufactured in high volume, each integrated circuit is unique due to the physical and environmental randomness introduced during fabrication under the same manufacturing steps and using same material. These inherent variations may be extracted and used as their unique identifications. To use as identifications, physically unclonable functions (PUF) which harvest the static inherent variations have been used to generate a unique signature. A type of PUF is built with an SRAM array. The way to generate the signature is by powering up the SRAM array. Most of the bits in the SRAM array tend to be powered up to a preferred state due to inherent biases. Some of the cells in the SRAM array have similar physical properties and tend to be powered up to different states each time due to noise. Accordingly, a testing method is proposed in the disclosure to measure the distribution of the transistor variations in a PUF device to generate the stable bits for signature use and employed in the process development phase to understand the variation distribution so as to tighten the process.

FIG. 1 illustrates a normal distribution plot of stable and unstable bits in a physically unclonable function (PUF) device according to an exemplary embodiment of the disclosure. In the plot, a fixed amount of noise (i.e., the noise is determined by the supply voltage) is given. The region A1 exhibits stable bits (i.e., strong reliable bits), which are used for the generation of signature in the PUF device. In other words, the static variation (i.e., process variation) is smaller than a predetermined threshold, where the predetermined threshold value is the noise range from the supply voltage. In some embodiments the predetermined threshold value is defined by the controller. In some embodiments, the predetermined value is determined as the probability factor to quantify the process distribution.

The region A2 exhibits unstable bits (i.e., weak unreliable bits), which are defined as the bits subjected to noise introduced in the variation parameters such as supply voltage and are not suitable for generating the signature in the PUF device. In detail, the static variations must be larger than the noise bound to come up to the same value during each powering up operation. However, the PUF cells presented in the middle of the distribution curve are subjected to noise. The physical properties of these PUF cells are not strong enough to overcome the disturbance generated by noise. Therefore, the outcome of the states of the closely matched PUF cells are subjected to noise, thus they are unreliable for signature generation but they may be used to approximate the tightness of process distribution. The region A3 is defined as equivalent noise bound introduced by an input (i.e., supply voltage). The noise level may be defined and/or controlled by the controller. When the static variation is small and less than the noise bound (i.e., noise range), then the outcome from powering up will tend to fluctuate.

Figure 2:
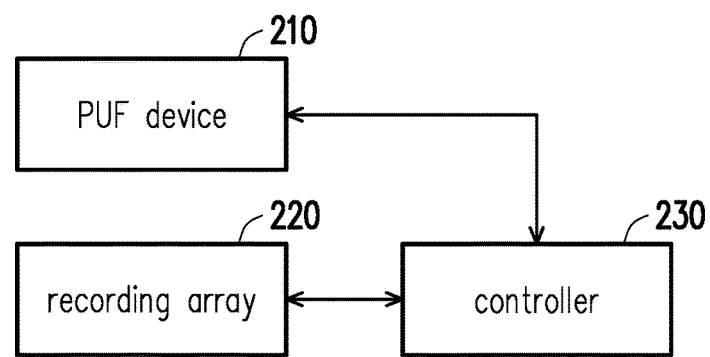
FIG. 2 illustrates a block diagram of an electronic device for testing a process distribution variation in a PUF device according to an exemplary embodiment of the disclosure.

FIG. 2 illustrates a block diagram of an electronic device for testing a process distribution variation in a PUF device according to an exemplary embodiment of the disclosure. Referring to FIG. 2, a process variation evaluation device 200 includes a PUF device 210, a recording array 220, and a controller 230. The PUF device 210 includes a plurality of PUF cells. The controller 230 is coupled to the PUF cells and the recoding array 220, and is configured to iteratively power up the PUF device 210 in various conditions (i.e., different temperatures and different supply voltages), and detect a state change of each PUF cells. The controller 230 compares a current state in a current iteration and a previous state in a previous iteration of each PUF cell to detect the state change and sets a value "1" indicating the state change in a corresponding bit in the recording array 220. After a number of iterations, the controller 230 counts a number of bits with the set value "1" in the recording array 220 and evaluates a variation of the process according the counted number.

In some embodiments, the controller 230 may record the previous state of each PUF cell in the previous iteration in a recording medium such as a memory or another PUF device so as to compare the current state of each PUF cell in the current iteration with the recorded previous state. For example, the controller 230 is coupled to a second PUF device (for example, an another PUF device used for recording the current state which is used as the previous state of the PUF device in a next iteration under process variation evaluation). The controller 230 records the previous state of each PUF cell in the second PUF device 230 in the previous iteration and compares the current state of each PUF cell in the current iteration with the previous state recorded in the second PUF device 230.

In some embodiments, the controller 230 performs an exclusive OR (XOR), operation on corresponding PUF cells in the PUF device 210 and the second PUF device 230 to obtain a comparison result, and then performs an OR operation on the corresponding bits of the comparison result and the recording array 220 to set the values indicating the state change in the corresponding bits in the recoding array 220. In some embodiments, the controller 230 uses a logic circuit including different combination of logic gates (e.g., AND, OR, NOT, XOR, XNOR, Flip flops, etc.) to obtain the comparison result. The logic circuit used in the controller 230 for evaluation is not limited in this disclosure.

The controller 230 calculates a ratio of the counted number to a size of the PUF device (i.e., array size of the PUF device), and compares the ratio with a predetermined threshold to evaluate the variation of the process. If the ratio is higher than the predetermined threshold, the controller 230 determines the process has a large variation, and then determines that the PUF device 210 is unreliable for signature generation. If the ratio is not higher than the predetermine threshold, the controller 230 determines the process has small variation which results in strong reliable bits used for signature generation. By this process variation evaluation method, the process variations distribution tightness may be effectively determined without adding any extra hardware (monitoring circuits) on the different part of the wafer.

Figure 3:
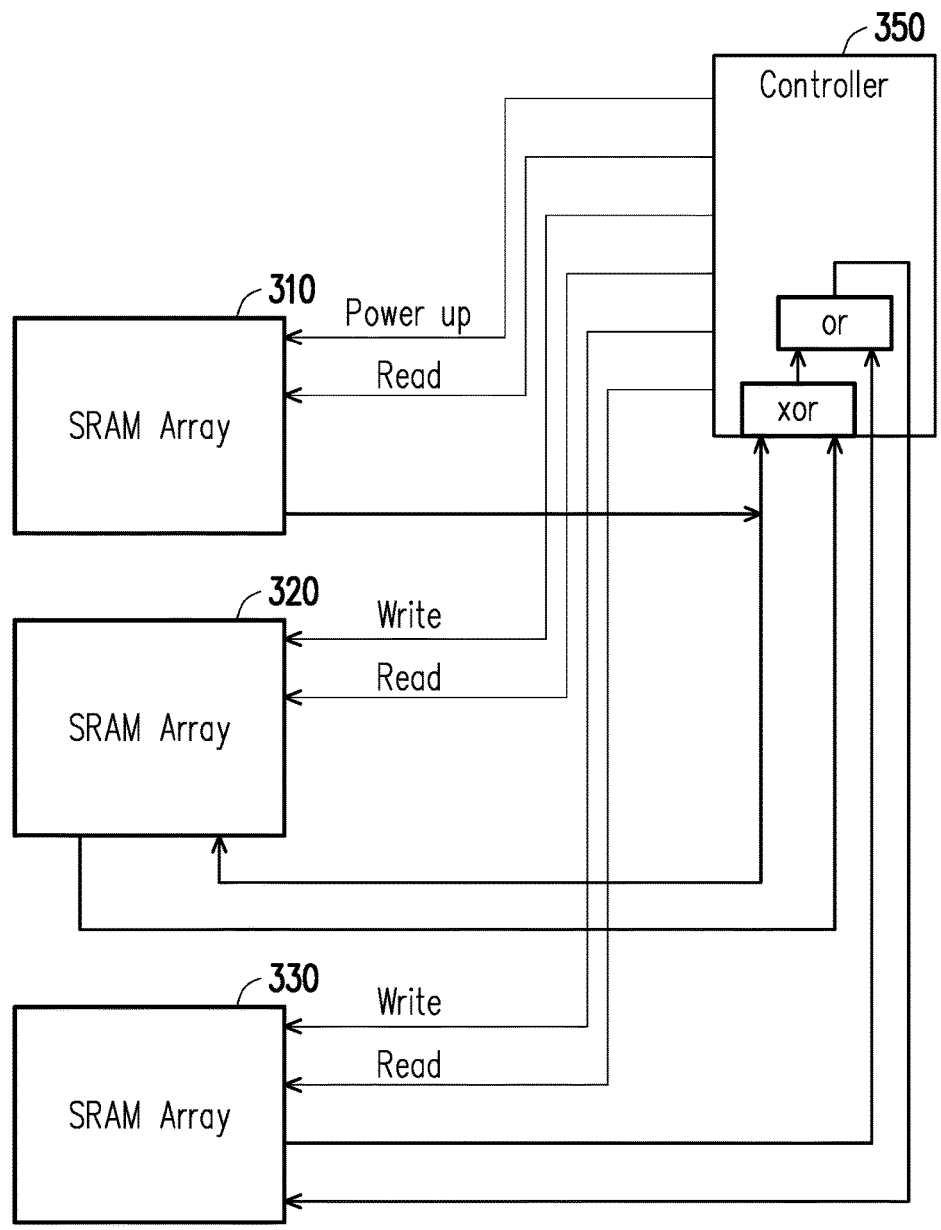
FIG. 3 illustrates a block diagram of a process variation evaluating device according to an exemplary embodiment of the disclosure.

FIG. 3 illustrates a block diagram of a process variation evaluating device according to an exemplary embodiment of the disclosure. Referring to FIG. 3, a process variation evaluation device 300 includes a plurality of SRAM arrays 310, 320, 330, and a controller 350. Each of the SRAM arrays 310, 320, 330 includes a plurality of cells. In some embodiments, one of the SRAM array 310, 320, 330 may serve as a recording array (i.e., SRAM array 320) to record (i.e., write operation) the state of the SRAM array 310. The controller 350 is coupled to the SRAM array 310 and the SRAM array 320, and is configured to iteratively power up the SRAM array 310 in various conditions (i.e., different temperatures and/or different supply voltages), and detect a state change (i.e., read operation) of each cell. In some embodiments, the controller 350 compares a current state in a current iteration and a previous state in a previous iteration of each cell to detect the state change and sets a value "1" indicating the state change in a corresponding bit in the SRAM array 330. After a number of iterations, the controller 350 counts a number of bits with the set value "1" in the SRAM array 330 and evaluates a variation of the process according the counted number. In some embodiments, the controller 350 records the previous state of each cell in the SRAM array 320 in the previous iteration and compares the current state of each cell in the current iteration with the previous state recorded in the SRAM array 320.

In some embodiments, the controller 350 performs an exclusive OR (XOR) operation on corresponding cells in the SRAM array 310 and the second SRAM array 330 to obtain a comparison result, and then performs an OR operation on the corresponding bits of the comparison result and the SRAM array 330 to set the values indicating the state change in the corresponding bits in the SRAM array 330. In some other embodiments, the controller 350 uses a logic circuit including different combination of logic gates (e.g., AND, OR, NOT, XOR, XNOR, Flip flops, etc.) to obtain the comparison result. The logic circuit used in the controller 350 for evaluation is not limited in this disclosure.

In some embodiments, the controller 350 calculates a ratio of the counted number to a size of the SRAM array, and compares the ratio with a predetermined threshold to evaluate the variation of the process. If the ratio is higher than a predetermined threshold, the controller 350 determines the process has a large variation, and then determines the SRAM array 310 is unreliable for signature generation. If the ratio is not higher than the predetermine threshold, the controller 350 determines the process has small variation which results in strong reliable bits used for signature generation. By this process variation evaluation method, the process variations distribution tightness may be effectively determined without adding any extra hardware (monitoring circuits) on the different part of the wafer.

Figure 4:
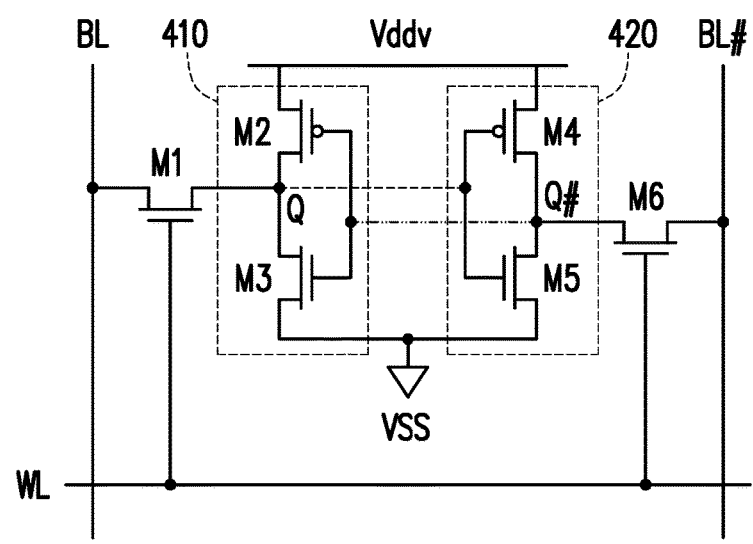
FIG. 4 illustrates a schematic diagram of a PUF cell according to an exemplary embodiment of the disclosure.

FIG. 4 illustrates a schematic diagram of a PUF cell according to an exemplary embodiment of the disclosure. The PUF cell 400 is, for example, a SRAM cell and includes two access transistors M1 and M6 which are implemented with CMOS transistors of N-type or P-type, but the disclosure is not limited thereto. The PUF cell 400 further includes, a cross-coupled inverter pair configured to generate a bit line signal BL and a complementary bit line signal BL#. The cross-coupled inverter pair is configured with a first circuit 410 and a second circuit 420. The first circuit 410 having a first pair of transistors M2 and M3 forms an inverter pair, and generates an output at an internal voltage node Q which is defined as a first output node of the PUF cell 400. The second circuit 420 having a second pair of transistors M4 and M5 forms an inverter pair, and generates an output at an internal voltage node Q# which is defined as a second output node of the PUF cell 400.

The first circuit 410 and second circuit 420 includes CMOS transistors, in which transistors M2 and M4 are PMOS transistors coupled to a high side, that is, a first predetermined voltage Vddv, which is also the supply voltage of the cross-coupled inverter pair. Similarly, the transistors M3 and M5 are NMOS transistors coupled to a low side, that is, a ground voltage VSS.

The input terminal of the first circuit 410 receives input from the output node Q# and the input terminal of the second circuit 420 receives input from the output node Q. The first circuit 410 and second circuit 420 are configured to generate the bit line signal BL and the complementary bit line signal BL# through the transistor M1 and the transistor M6 respectively. The first terminal of the access transistors M1 and M6 are coupled to bit line BL and complementary bit line BL#. The second terminal of the access transistors M1 and M6 are coupled to the control terminal of the first output node Q and the second output node Q#, which is also the control terminal of the cross-coupled inverter pair. The control terminal of the transistor M6 and the transistor M1 are enabled by a word line signal WL to turn on the transistors to pass the output from the first output node Q and the second output node Q# to the bit line BL and the complementary bit line BL#.

Figure 5A:
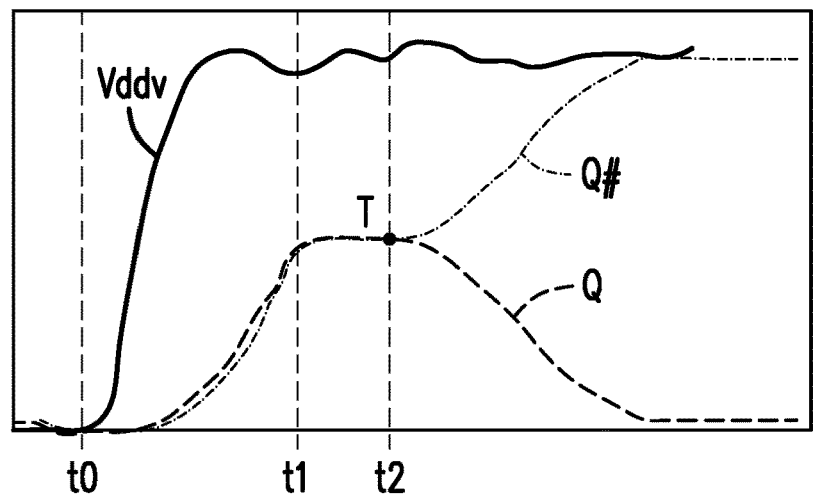
FIGS. 5A & 5B illustrates an operation waveform of a PUF cell according to an exemplary embodiment of the disclosure.
Figure 5B:
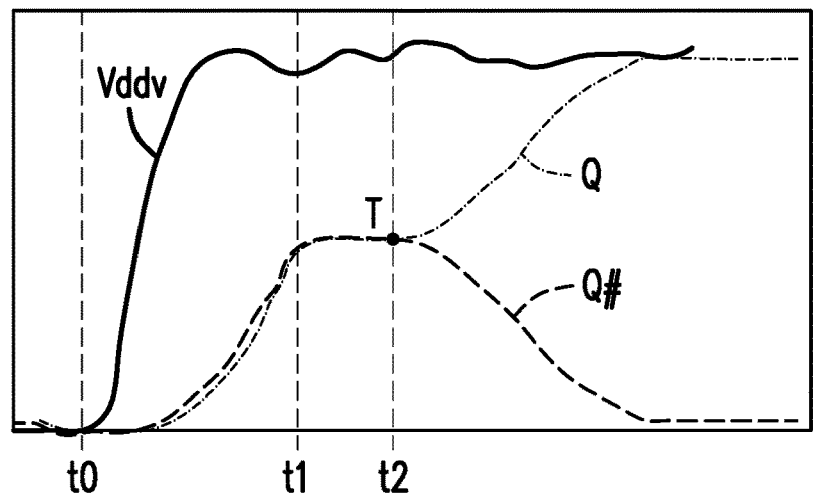

FIGS. 5A & 5B illustrates an operation waveform of the PUF cell 400 in FIG. 4 according to an exemplary embodiment of the disclosure. With reference to FIG. 4, the PUF cell 400 includes two access transistors M1 and M6, which receives the word line enable signal WL to power up the PUF cell 400. After the PUF cell 400 is powered up, the voltages of the output nodes Q and Q# of the cross-coupled inverter pair will start to increase as the voltage Vddv supplied to the cross-coupled inverter pair starts to increase at time t0. At time t1, the voltages of the output node Q and the output node Q# reach a stable voltage, which is also termed as metastable equilibrium of the cross-coupled inverter pair. The voltages of the output node Q and the output Q# remain in metastable equilibrium until time t2. In other words, during the time period (from time t1 to time t2), the voltages of the output voltage node Q and the output voltage node Q# are in metastable equilibrium. As the voltages of the output node Q and the output node Q# reach a trip point T of the inverter, one of the inverter will trigger first and will start to function as an inverter bringing down the voltage of the output node Q, which is the input of another inverter as shown in FIG. 4. As the voltage of the output node Q drops, the voltage at the output node Q# will reach an opposite logic, which is also termed as logic "1" and the voltage of the output node Q will reach a logic "0", which is also called "ground voltage".

Similarly, in FIG. 5B, with reference to FIG. 4, the second circuit 420 will trigger first and starts to bringing down the voltage of the output node Q#, which is the input of another inverter. As the voltage of the output node Q# drops, the voltage at the output node Q will reach the opposite logic "1", and the voltage of the output node Q# will reach the logic "0". With reference to FIG. 4, the PUF cell 400 also acts as a comparator which compares the voltages at the output node Q and the output node Q# and amplifies the voltages at the first output node Q and second output node Q# at the same time. The inverter trip T in the cross-coupled inverter pair depends upon on several factors such as effective ratio of N-type and P-type device, parasitic impedance of the transistor, and threshold voltage of the transistor etc. Even if all the device parameters are well-balanced, the outcome will depend upon the dynamic noise presented in the device, which is the source of randomness in the PUF cell 400.

Figure 6A:
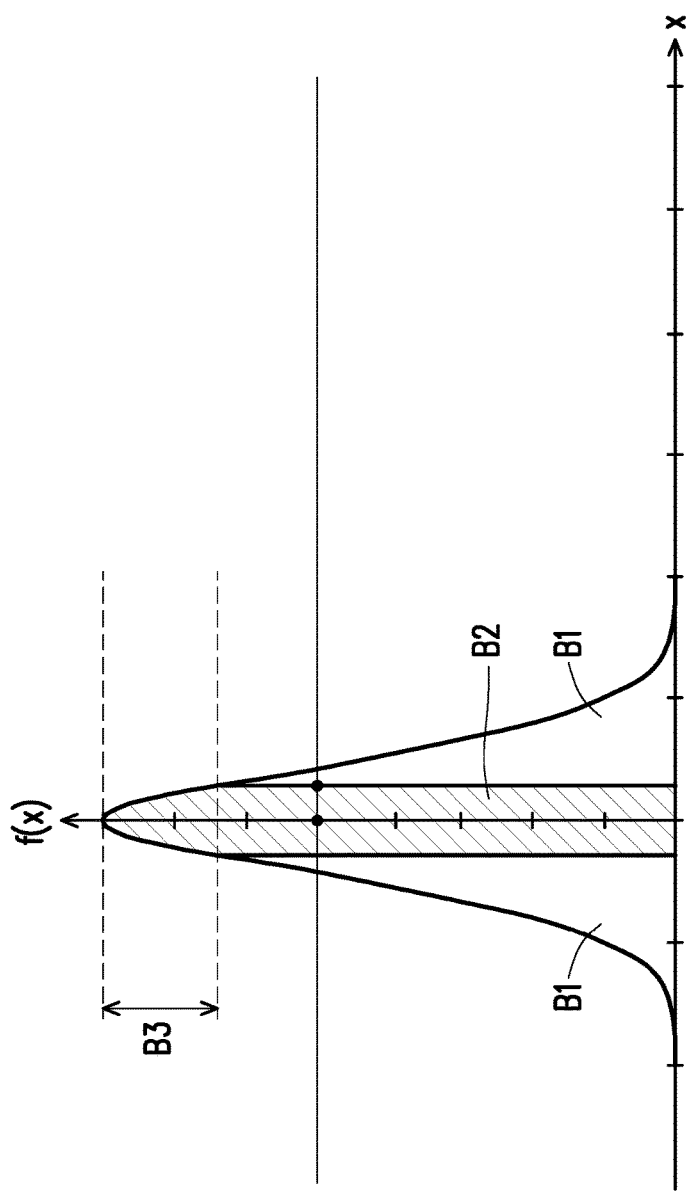
Figure 6B:
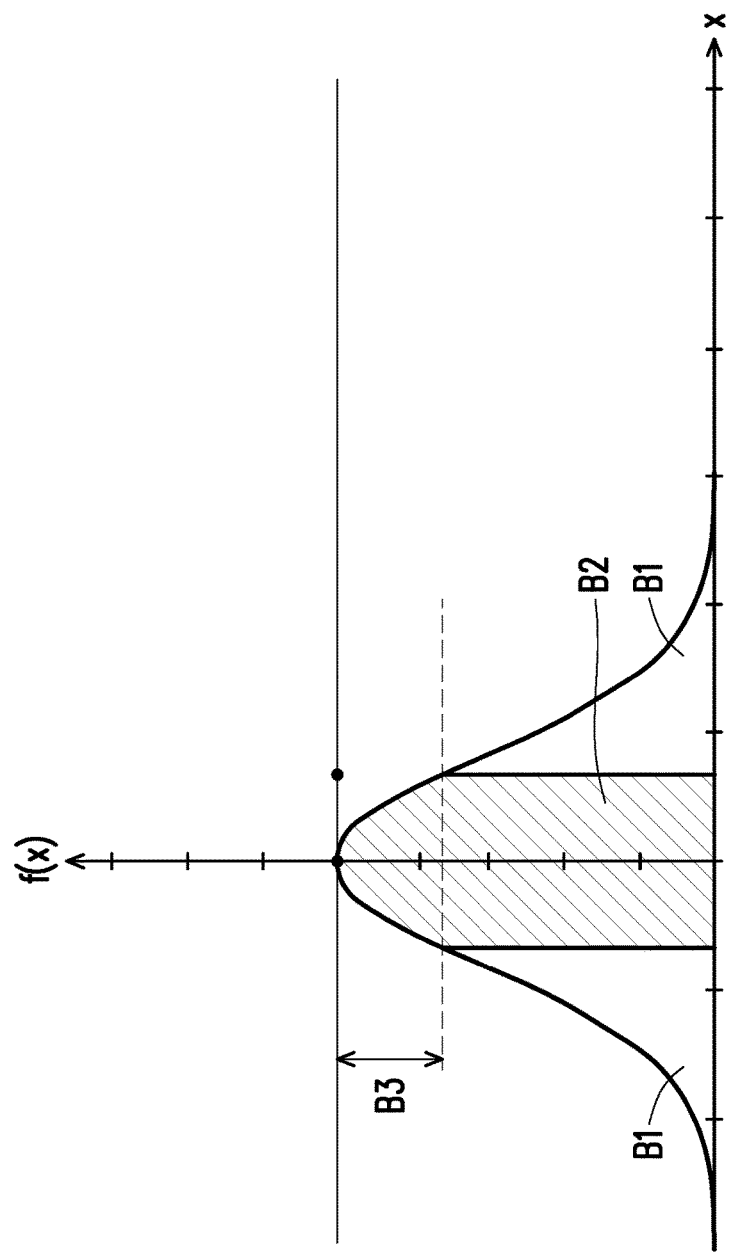

FIGS. 6A, 6B and 6C are plots illustrating distributions of stable and unstable bits in a PUF device according to an exemplary embodiment of the disclosure. The plots in FIGS. 6A, 6B and 6C are drawn with a same noise level (e.g. 0.14) represented as B3 in the y-axis range, in which the amount of the PUF cells which are "closely matches" varies. FIG. 6A shows a tighter distribution in which the PUF cells in the PUF device are not closely matched. Given the noise level 0.14, the number of cells (a fraction of total) is around 0.46 (or 46%). FIG. 6B shows a flatter distribution. With the same noise level 0.14, the fraction of cells that are subject to the effect is around 0.595 (59.5%) due to the presence of more unreliable bits in the PUF device as compared to the plot in FIG. 6A. In detail, by comparing with the region B1 (i.e., stable bits) and the region B2 (i.e., unstable bits) of FIG. 6A, in the plot in FIG. 6B, the region B1 (i.e., stable bits) is decreased, and the region B2 (i.e., unstable bits) is increased. FIG. 6C shows an even wider distribution. Under the same noise level, the fraction is around 0.67 (67%). From FIG. 6A to FIG. 6C, it is known that, as the distribution of the process spread out further (i.e. more variations), the number of unstable bits will increase. Based on this fact, a method is given to evaluate the process variation distribution tightness.

Figure 7:
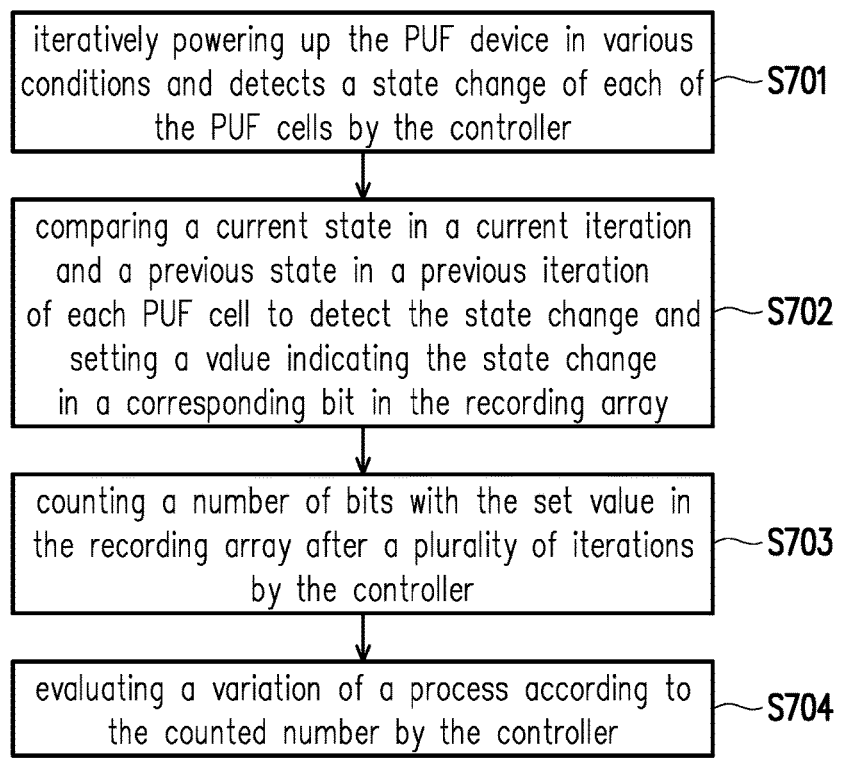
FIG. 7 is a flowchart to illustrate a process variation evaluating method in a physically unclonable device.

FIG. 7 is a flowchart to illustrate a process variation evaluating method, adapted to an electronic device having a PUF device and a recording array, and the method includes following steps. In step S701, the controller iteratively powers up the PUF device in various conditions and detects a state change of each PUF cells. After the state change of each PUF cells is detected, in step S702, the controller compares a current state in a current iteration and a previous state in a previous iteration of each PUF cell to detect the state change and set a value indicating the state change in a corresponding bit in the recording array. In step S703, the controller counts a number of bits with the set value in the recording array after a plurality of iterations. In step S704, the controller evaluates a variation of a process according to the counted number. By this process variation evaluation method, the process variations distribution tightness may be effectively determined without adding any extra hardware (monitoring circuits) on the different part of the wafer.

An embodiment of the present disclosure is directed to a non-transitory computer readable medium, which records computer program to be loaded into an electronic apparatus to execute the steps of the aforementioned method: iteratively powering up the PUF device in various conditions and detecting a state change of each PUF cells which comprises comparing a current state in a current iteration and a previous state in a previous iteration of each PUF cell to detect the state change and setting a value indicating the state change in a corresponding bit in the recording array; counting a number of bits with the set value in the recording array after a plurality of iterations; and evaluating a variation of a process according to the counted number.

According to some embodiments, the disclosure provides a process variation evaluating device which includes a PUF device having a plurality of PUF cells, and a recording array. The controller is coupled to the PUF cells and the recording array, and configured to iteratively power up the PUF device in various conditions and detect a state change of each PUF cells. The controller compares a current state in a current iteration and a previous state in a previous iteration of each PUF cell to detect the state change and sets a value indicating the state change in a corresponding bit in the recording array. The controller counts a number of bits with the set value in the recording array after a plurality of iterations, and evaluates a variation of a process according to the counted number.

According to some embodiments, the disclosure provides a process variation evaluating method, adapted to an electronic device having a PUF device, a recording array, and a controller, the method comprising following steps: iteratively powering up the PUF device in various conditions and detecting a state change of each of a plurality of PUF cells in the PUF device by the controller; comparing a current state in a current iteration and a previous state in a previous iteration of each PUF cell to detect the state change and setting a value indicating the state change in a corresponding bit in the recording array; counting a number of bits with the set value in the recording array after a plurality of iterations; and evaluating a variation of a process according to the counted number by the controller.

According to some embodiments, the disclosure provides a non-transitory computer readable medium, storing programs to be loaded into an electronic device to perform steps of: iteratively powering up the PUF device in various conditions and detecting a state change of each of a plurality of PUF cells in the PUF device; comparing a current state in a current iteration and a previous state in a previous iteration of each PUF cell to detect the state change and setting a value indicating the state change in a corresponding bit in the recording array; counting a number of bits with the set value in the recording array after a plurality of iterations; and evaluating a variation of a process according to the counted number.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A process variation evaluating device, comprising:
   a physical unclonable function (PUF) device comprising a plurality of PUF cells;
   a recording array; and
   a controller, coupled to the PUF cells and the recording array, and configured to iteratively power up the PUF device in various conditions and detect a state change of each of the PUF cells, wherein
   the controller compares a current state in a current iteration and a previous state in a previous iteration of each PUF cell to detect the state change and sets a value indicating the state change in a corresponding bit in the recording array; and
   the controller counts a number of bits with the set value in the recording array after a plurality of iterations and evaluates a variation of a process according to the counted number.

2. The process variation evaluating device of claim 1, further comprising:
   a second PUF device, coupled to the controller, wherein the controller records the previous state of each PUF cell in the second PUF device in the previous iteration and compares the current state of each PUF cell in the current iteration with the previous state recorded in the second PUF device.

3. The process variation evaluating device of claim 1, wherein
   the controller performs an exclusive OR (XOR) operation on corresponding PUF cells in the PUF device and the second PUF device to obtain a comparison result; and
   the controller performs an OR operation on the corresponding bits of the comparison result and the recording array to set the values indicating the state change in the corresponding bits in the recording array.

4. The process variation evaluating device of claim 1, wherein the controller calculates a ratio of the counted number to a size of the PUF device and compares the ratio with a predetermined threshold to evaluate the variation of the process, wherein
   if the ratio is higher than the predetermined threshold, the controller determines the process has a large variation; and
   if the ratio is not higher than the predetermined threshold, the controller determines the process has a small variation.

5. The process variation evaluating device of claim 1, wherein the PUF device is a SRAM array comprising:
   a cross-coupled inverter pair, wherein each of the inverter is configured to generate a first output or a second output;
   two access transistors, configured to power up the cross-coupled inverter pair through a word line enable signal.

6. The process variation evaluating device of claim 5, wherein the controller detects a state of the PUF cell by detecting a voltage signal of a control terminal of one of the inverters.

7. The process variation evaluating device of claim 5, wherein a first terminal of the access transistors are coupled to a bit line and a complementary bit line,
   a second terminal of the access transistors are coupled to the control terminal of one of the inverters.

8. The process variation evaluating device of claim 1, wherein the conditions comprises at least one of a temperature and a voltage supplied to the PUF device.

9. A process variation evaluating method, adapted to an electronic device having a PUF device, a recording array, and a controller, the PUF device comprising a plurality of PUF cells, and the method comprising following steps:
   iteratively powering up the PUF device in various conditions and detects a state change of each of the PUF cells by the controller, comprising:
   comparing a current state in a current iteration and a previous state in a previous iteration of each PUF cell to detect the state change and setting a value indicating the state change in a corresponding bit in the recording array;
   counting a number of bits with the set value in the recording array after a plurality of iterations by the controller; and
   evaluating a variation of a process according to the counted number by the controller.

10. The process variation evaluating method of claim 9, wherein the electronic device further comprises a second PUF device coupled to the controller, and the method further comprises:
    recording the previous state of each PUF cell in the second PUF device in the previous iteration and comparing the current state of each PUF cell in the current iteration with the previous state recorded in the second PUF device.

11. The process variation evaluating method of claim 9, wherein the step of comparing the current state in the current iteration and the previous state in the previous iteration of each PUF cell and setting the value indicating the state change in the corresponding bit in the recording array comprises:
   performing an exclusive OR (XOR) operation on corresponding PUF cells in the PUF device and the second PUF device to obtain a comparison result; and
   performing an OR operation on the corresponding bits of the comparison result and the recording array to set the values indicating the state change in the corresponding bits in the recording array.

12. The process variation evaluating method of claim 9, wherein the step of evaluating the variation of the process according to the counted number by the controller comprises:
   calculating a ratio of the counted number to a size of the PUF device and comparing the ratio with a predetermined threshold to evaluate the variation of the process;
   determining the process has a large variation if the ratio is higher than the predetermined threshold; and
   determining the process has a small variation if the ratio is not higher than the predetermined threshold.

13. The process variation evaluating method of claim 9, wherein the PUF device is a SRAM array comprises a cross-coupled inverter pair and two access transistors, and the method comprises:
   powering up the cross-coupled inverter pair through a word line enable signal by the access transistors; and
   determining the current state according to a first output and a second output generated by the cross-coupled inverter pair.

14. The process variation evaluating method of claim 13, wherein the step of determining the current state according to the first output and the second output generated by the cross-coupled inverter pair comprises:
   determining the current state by detecting a voltage signal of a control terminal of one of the inverters.

15. The process variation evaluating method of claim 13, wherein a first terminal of the access transistors are coupled to a bit line and a complementary bit line,
   a second terminal of the access transistors are coupled to the control terminal of one of the inverters.

16. The process variation evaluating method of claim 9, wherein the conditions comprises at least one of a temperature and a voltage supplied to the PUF device.

17. A non-transitory computer readable medium, storing programs to be loaded into an electronic device having a PUF device, a recording array and a controller, to perform steps of:
   iteratively powering up the PUF device in various conditions and detects a state change of each of a plurality of PUF cells in the PUF device by the controller, comprising:
   comparing a current state in a current iteration and a previous state in a previous iteration of each PUF cell to detect the state change and setting a value indicating the state change in a corresponding bit in the recording array;
   counting a number of bits with the set value in the recording array after a plurality of iterations by the controller; and
   evaluating a variation of a process according to the counted number by the controller.

18. The non-transitory computer readable medium of claim 17, wherein the electronic device further comprises a second PUF device coupled to the controller, and the method further comprises further perform steps of:
   recording the previous state of each PUF cell in the second PUF device in the previous iteration and comparing the current state of each PUF cell in the current iteration with the previous state recorded in the second PUF device.

19. The non-transitory computer readable medium of claim 17, wherein the step of comparing the current state in the current iteration and the previous state in the previous iteration of each PUF cell and setting the value indicating the state change in the corresponding bit in the recording array comprises:
   performing an exclusive OR (XOR) operation on corresponding PUF cells in the PUF device and the second PUF device to obtain a comparison result; and
   performing an OR operation on the corresponding bits of the comparison result and the recording array to set the values indicating the state change in the corresponding bits in the recording array.

20. The non-transitory computer readable medium of claim 17, wherein the step of evaluating the variation of the process according to the counted number by the controller comprises:
   calculating a ratio of the counted number to a size of the PUF device and comparing the ratio with a predetermined threshold to evaluate the variation of the process;
   determining the process has a large variation if the ratio is higher than the predetermined threshold; and
   determining the process has a small variation if the ratio is not higher than the predetermined threshold.

\* \* \* \* \*